(12) United States Patent
Chun

(10) Patent No.: US 10,746,811 B2
(45) Date of Patent: Aug. 18, 2020

(54) WIRELESS RECEPTACLE TESTER SYSTEM

(71) Applicant: James Chun, Carlsbad, CA (US)

(72) Inventor: James Chun, Carlsbad, CA (US)

( * ) Notice: Subject to any disclaimer, the term of this patent is extended or adjusted under 35 U.S.C. 154(b) by 31 days.

(21) Appl. No.: 15/970,529

(22) Filed: May 3, 2018

(65) Prior Publication Data

US 2018/0321298 A1 Nov. 8, 2018

Related U.S. Application Data

(60) Provisional application No. 62/501,227, filed on May 4, 2017.

(51) Int. Cl.
*G01R 31/67* (2020.01)

(52) U.S. Cl.
CPC .................. *G01R 31/67* (2020.01)

(58) Field of Classification Search
CPC .... G05B 13/02; G05B 13/0205; G05B 15/02; G05B 13/026; G01D 4/002; G01R 21/133; G01R 21/00; G01R 22/063; G01R 31/025; G01R 31/041; G01R 11/00; G01R 15/14; G01R 15/18; G01R 15/202; G01R 19/0092; G01R 19/2513; G01R 21/06; G01R 27/2605; G01R 27/28; G01R 29/0842; G01R 31/002; G08C 17/02; G08C 19/16; G08C 2201/93; G08C 23/04; H04L 2012/2841; H04L 12/2807; H04L 12/2809; H04L 12/2816; H04L 12/2825; H04L 12/2836; H04L 12/66; H04W 48/16; H04W 4/80; H01H 2300/03; H01H 9/0271; H01H 9/54; H01H 23/04; G06F 1/266; H04M 1/72533

See application file for complete search history.

(56) References Cited

U.S. PATENT DOCUMENTS

| 4,034,284 | A * | 7/1977 | Peplow ............... G01R 19/145 324/508 |
| 8,233,803 | B2 * | 7/2012 | Meyer .................... G08C 17/02 398/106 |
| 9,366,702 | B2 * | 6/2016 | Steele ...................... H02J 4/00 |
| 9,575,091 | B2 * | 2/2017 | Reeder, III ........... G01R 1/0408 |
| 9,766,270 | B2 * | 9/2017 | Heydron ................ G01R 15/00 |
| 10,088,500 | B2 * | 10/2018 | Wiesemann ............. G01R 1/04 |

(Continued)

*Primary Examiner* — Vinh P Nguyen

(74) *Attorney, Agent, or Firm* — Dean A Craine; Marisa C Whitaker

(57) ABSTRACT

A wireless receptacle tester system that includes an electrical tester with protruding terminal blades from a rigid housing. The tester includes an isolation circuit connected to an ACV/DCV converter and an Analog/Digital Converter. When a voltage is detected by, the tester, the voltage is automatically measured by the Analog/Digital Converter. Connected to the ACV/DCV converter is a DC Volt Regulator that regulates the 5 DC volts needed for the Analog/Digital converter, a microprocessor and a first Bluetooth module. The system also includes a Smartphone with a display and a second Bluetooth transceiver configured to pair with the first Bluetooth module. Loaded into the working memory of the Smartphone is a voltage display application. When the Smartphone is operated in the vicinity of the tester and the voltage display application is activated, voltage information is automatically transmitted from the tester to the second Bluetooth transceiver and displayed on the display.

3 Claims, 2 Drawing Sheets

(56) References Cited

U.S. PATENT DOCUMENTS

2014/0278259 A1\* 9/2014 Neeley ................. G01D 7/08
　　　　　　　　　　　　　　　　　　　　702/189
2016/0209899 A1\* 7/2016 Brantner ............... H04L 12/12

\* cited by examiner

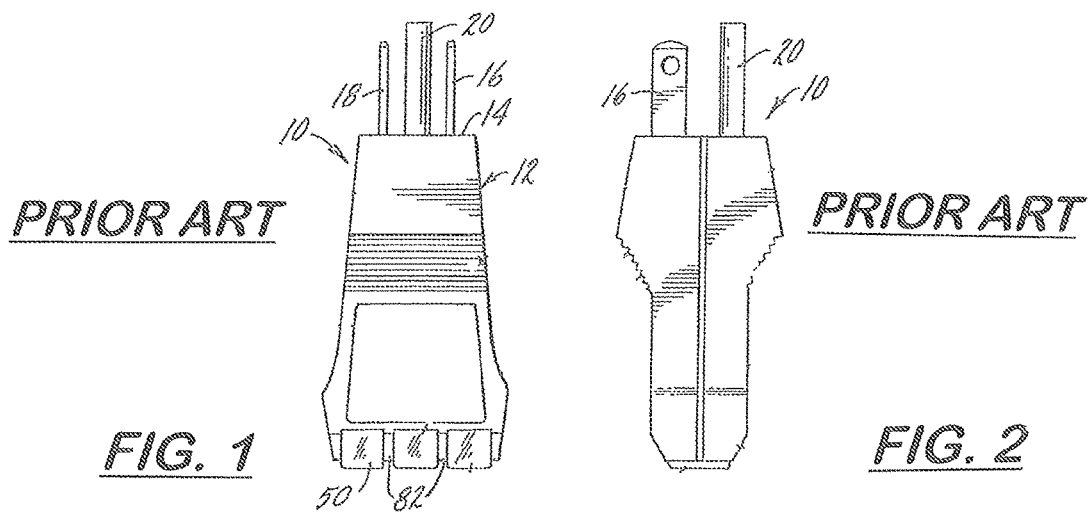
FIG. 1 PRIOR ART
FIG. 2 PRIOR ART
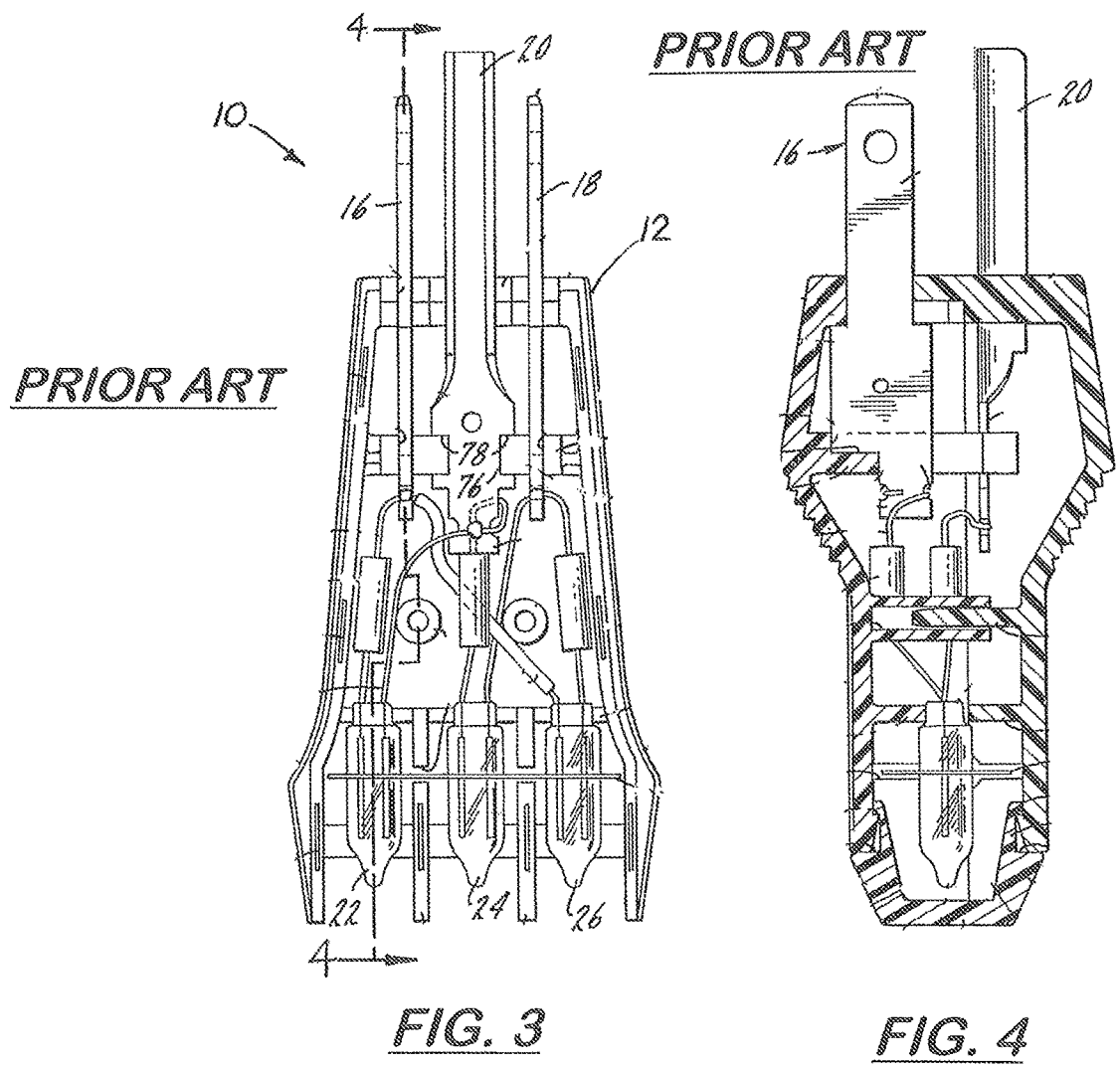
FIG. 3 PRIOR ART
FIG. 4 PRIOR ART

WIRELESS RECEPTACLE TESTER SYSTEM

This utility patent application is based on and claims the filing date benefit of U.S. provisional patent application (Application No. 62/501,227) filed on May 4, 2017.

Notice is given that the following patent document contains original material subject to copyright protection. The copyright owner has no objection to the facsimile or digital download reproduction of all or part of the patent document, but otherwise reserves all copyrights.

BACKGROUND OF THE INVENTION

1. Field of the Invention

This invention pertains to electrical testing equipment and more particularly to compact, handheld testers for checking the wiring in a wall electrical receptacle.

2. Description of the Related Art

U.S. Pat. No. 4,034,284 teaches a hand-held wall receptacle wiring tester with protruding terminal blades from one end that are pushed into a wall electrical receptacle. The housing includes indicator lamps and electrical connecting means between the lamps and the terminal blades so that when the tester is plugged into a wall receptacle, the lighting of one or more lamps indicates respective predetermined wiring conditions of the wall receptacle.

The tester in U.S. Pat. No. 4,034,284 is desirable because it is lightweight, compact, easy to use and durable. Unfortunately, when the electrician must know a precise reading from the receptacle, such as voltage, a larger circuit tester with a display, such as a digital multi-meter, (DMM) must be used.

Most electricians carry a Smartphone when working on a job site with built-in display and built-in Bluetooth transceivers. What is needed is an improved hand-held wall receptacle wiring tester with protruding terminal blades and with one or more lamps to indicate wiring conditions of a wall receptacle configured to selectivity pair with the Bluetooth transceiver in an electrician's Smartphone so digital readings from the tester can be transmitted to the smart phone's and displayed on the Smartphone's display thereby eliminating the need for a DMM.

SUMMARY OF THE INVENTION

FIGS. 1-4 are top plan view, a side elevational, an internal bottom view, and a side elevational view taken along line 4-4 in FIG. 3 of a hand-held electrical tester 10 in the prior art for checking the wiring of wall receptacles. The tester 10 is described in U.S. Pat. No. 4,034,284 and incorporated herein by reference. Such testers 10 typically include a rigid housing 12 having a set of electrical terminal blades 16, 18 and 20 protruding from one end 14. The terminal blades include two parallel flat blades 16 (hot) and 18 (neutral) and a generally U-shaped ground blade 20. The terminal blades 16 and 18, which are arranged in the conventional fixed positional relationship for insertion into a wall receptacle, are mounted within the housing 12 in a manner shown. The housing 12 also contains three indicator lamps 22, 24 and 26, and an outlet tester circuit 13 between each lamp 22, 24, and 26 and a respective pair of the terminal blades 16, 18, and 20 so that the lighting of each lamp 22, 24, or 26 and each combination of lamps indicates a predetermined wiring condition of a wall receptacle 5 into which the terminal blades 16, 18 and 20 may be inserted. The tester 10 may also include a GFI tester circuit 15.

The above tester 10 is useful for quickly and easily checking the polarity or wiring condition of a conventional three-prong electrical wall receptacle 5. To do this, the terminal blades 16, 18 and 20 of the tester 10 are inserted into the wall receptacle 5 As a result, a lamp or combination of lamps 22, 24, 26 which corresponds to the wiring condition of the receptacle 5 will light up to indicate the wiring information to the electrician or inspector. If no lamp 122, 24, or 26 lights up, either the hot terminal of the receptacle 5 is open or no power is being supplied to the receptacle 5.

Checking receptacles 5 with the tester 10 has several significant advantages. First, the tester 10 is lightweight, easy to use, and fits into the electrician's pocket, or belt pouch. Second, the tester 10 is a single unit, durable and does not require a battery.

The invention described is an improved receptacle testing system that includes a modified tester 10 that has all of the components listed above for determining the wiring condition of a wall receptacle but also includes components that convert the analog signal output to an digital signal and then transmits the digital signal to a Smartphone where it may be read on the Smartphone's display. More specifically, the tester 10 includes an ACV/DCV converter, a DC Volts Regulator, an Analog/Digital Converter, a microprocessor, and a Bluetooth module. The Smartphone has built-in display and a built-in second Bluetooth module configured to pair with the first Bluetooth module in the tester. Loaded into the working memory of the Smartphone is a voltage display application. When the Smartphone is operated in the vicinity of the tester and the voltage display application is activated on the Smartphone, voltage information from the tester is transmitted to the Smartphone and displayed on the Smartphone's display.

DESCRIPTION OF THE DRAWINGS

FIGS. 1-4 are view of a hand-held electrical tester found in the prior art for checking the wiring of wall receptacles and described in U.S. Pat. No. 4,034,284

DESCRIPTION OF THE PREFERRED EMBODIMENT(S)

Figure 5:
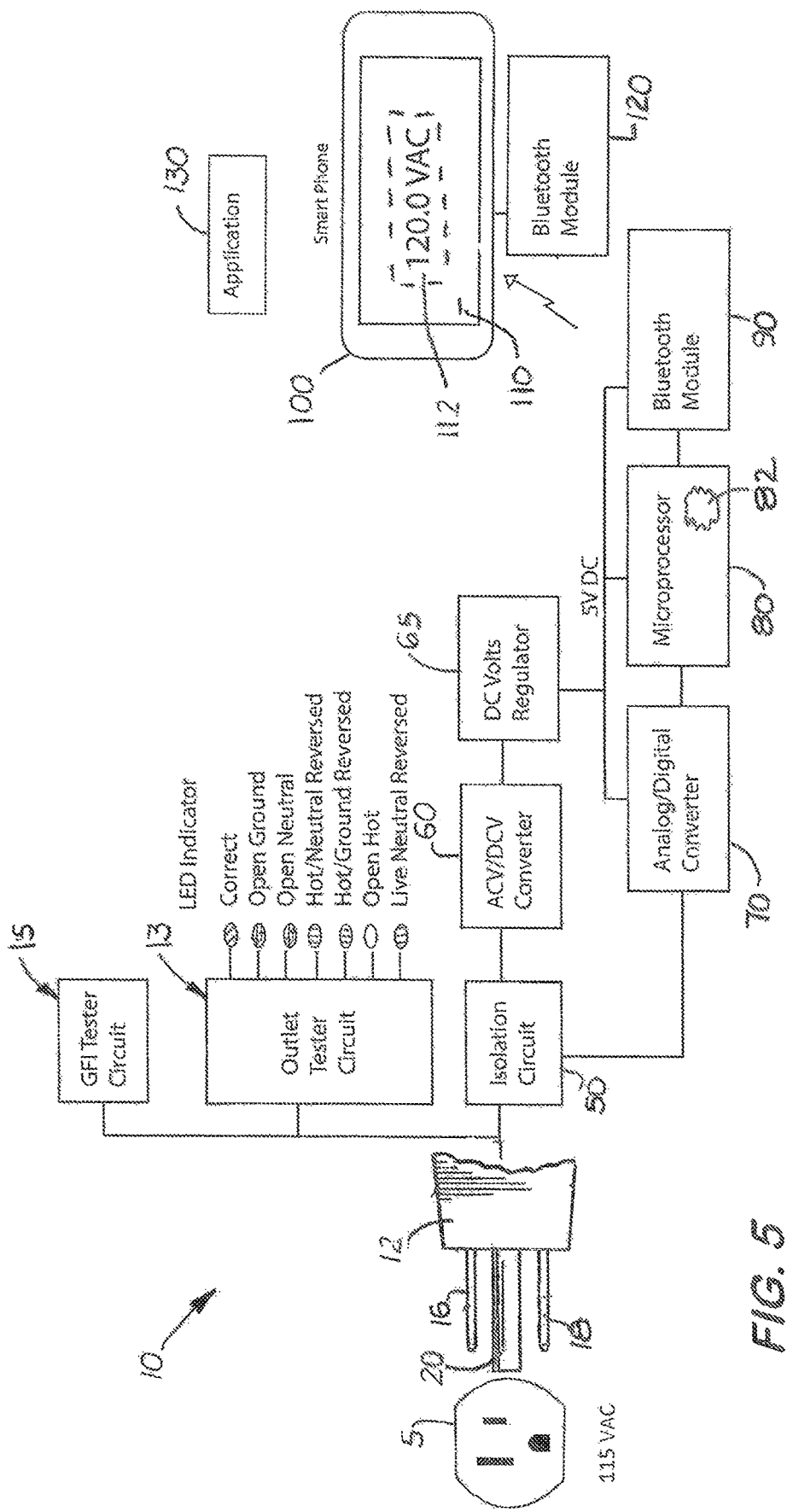
FIG. 5 is an illustration show the hand-held electrical receptacle tester system that includes the improved tester and a Smartphone with working memory and a voltage display application loaded into Smartphone's working memory.

An electrical receptacle testing system that includes an improved hand-held wall receptacle wiring tester 10 with protruding terminal blades 16, 18 and 20 from one end of a rigid housing 12 and with one or more lamps 22, 24, 26 to indicate wiring conditions of a receptacle. The tester 10 includes an isolation circuit 50 connected to are ACV/DCV converter 60 and an Analog/Digital Converter 70. The Analog/Digital Converter 70 is connected to a microprocessor 80, and a first Bluetooth t module 90. When a voltage is detected by the tester 10, the voltage is automatically measured by the Analog/Digital Converter 70. Connected to the isolation circuit 50 is a ACV/DCV converter 60. The ACV/DCV converter 60 is connected to a DC Volts Regulator 65. The DC Volt Regulator 65 regulates the 5 DC volts needed for the Analog/Digital converter 70, the microprocessor 80 and the first Bluetooth module 90.

The tester 10 is used with a Smartphone 100 with a built-in display 110 and a built-in second Bluetooth transceiver 120 configured to pair with the first Bluetooth module 90 in the tester 10. Loaded into the working memory 112 of the Smartphone 100 is an electrical circuit display application 130. When the Smartphone 100 is operated in the vicinity of the tester 10 and the application 130 is activated on the Smartphone 100, voltage information in digital format is automatically transmitted from the tester 10 to the Smartphone's second Bluetooth transceiver 120 and displayed on the Smartphone's display 110.

The electrical circuit that activate the lamps 18, 18, 20 are analog signals and must be converted into digital signals by the Analog/Digital converter 70. When the terminal blades 16, 18, and 20 on the tester 10 are plugged into a live receptacle, the electrical circuit is converted from 115 VAC to 5 VDC. The DC volts regulator 65 which maintains the voltage at 5 VDC is connected to the Analog/Digital Converter 70, the Microprocessor 80 and the first Bluetooth Module 90. The Microprocessor 80 includes a software program 82 that transmits the digital signal from the Analog Digital Converter 70 to the first Bluetooth module 90. The software program 82 also instructs the first Bluetooth module 90 to pair with a compatible second Bluetooth transceiver 120 operating in the vicinity. When paired with a compatible second Bluetooth transceiver 120 in a Smartphone 100, the digital voltage information is presented on the display 110.

In compliance with the statute, the invention described has been described in language more or less specific as to structural features. It should be understood however, that the invention is not limited to the specific features shown, since the means and construction shown, comprises the preferred embodiments for putting the invention into effect. The invention is therefore claimed in its forms or modifications within the legitimate and valid scope of the amended claims, appropriately interpreted under the doctrine of equivalents.

The invention claimed is:

1. A wireless receptacle tester system, comprising
   a. a wall receptacle wiring tester that includes a rigid housing with protruding terminal blades extending from one end of the rigid housing, the tester includes one or more lamps configured to be selectively illuminated individually or in combination to indicate different wiring electrical connection conditions of the wall receptacle, the tester including an outlet tester circuit configured to illuminate the lamps in a specific order to indicate the output voltage or wiring condition of a receptacle outlet when plugged into the receptacle outlet;
   b. an analog/digital converter configured to receive voltage analog signals from the terminal blades and to convert the voltage analog signals from the terminal blades into voltage digital signals;
   c, a first Bluetooth module located inside the tester configured to transmit the voltage digital signals from the analog/digital converter over a wireless network;
   d. a Smartphone with a second Bluetooth module configured to pair with the first Bluetooth module in the tester and receive the voltage digital signals from the first Bluetooth module, the Smartphone includes a visual display and working memory; and
   e. a Smartphone software application loaded into the working memory of the Smartphone, the software application configured to present the voltage digital signals from the tester on the display.

2. The wireless receptacle tester system, as recited in claim 1, further including an isolation circuit connected to the terminal blades and disposed between the ADC/DCV Converter and the Analog/Digital Converter.

3. The wireless receptacle tester system, as recited in claim 2, wherein said isolation circuit connects to the outlet tester circuit.

* * * * *